United States Patent
Aritomi et al.

(10) Patent No.: US 6,344,763 B1
(45) Date of Patent: Feb. 5, 2002

(54) SEMICONDUCTOR INTEGRATED CIRCUIT DEVICE THAT CAN SUPPRESS GENERATION OF SIGNAL SKEW BETWEEN DATA INPUT/OUTPUT TERMINALS

(75) Inventors: Kengo Aritomi; Takayuki Miyamoto, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/694,039

(22) Filed: Oct. 23, 2000

(30) Foreign Application Priority Data

Apr. 24, 2000 (JP) .......................... 12-122037

(51) Int. Cl.[7] .............................................. H03H 11/26
(52) U.S. Cl. .................. 327/283; 327/290; 365/225.7; 365/189.05
(58) Field of Search .................. 365/189.05, 189.06, 365/203, 96, 225.7; 327/270, 271, 276, 277, 283, 290, 525

(56) References Cited

U.S. PATENT DOCUMENTS

| | | | | |
|---|---|---|---|---|
| 4,837,520 A | * | 6/1989 | Golke et al. | 327/525 |
| 4,894,791 A | * | 1/1990 | Jiang et al. | 327/276 |
| 5,117,206 A | * | 5/1992 | Imamura | 331/158 |
| 5,416,436 A | * | 5/1995 | Rainard | 327/270 |
| 5,440,246 A | * | 8/1995 | Murray et al. | 327/525 |
| 5,521,863 A | * | 5/1996 | Kobayashi et al. | 365/189.05 |
| 5,859,806 A | * | 1/1999 | Wada | 365/207 |

FOREIGN PATENT DOCUMENTS

| | | |
|---|---|---|
| JP | 62-291216 | 12/1987 |
| JP | 3-219719 | 9/1991 |
| JP | 9-172356 | 6/1997 |

* cited by examiner

*Primary Examiner*—Timothy P. Callahan
*Assistant Examiner*—An T. Luu
(74) *Attorney, Agent, or Firm*—McDermott, Will & Emery

(57) ABSTRACT

A semiconductor integrated circuit device includes a plurality of data input/output terminals to transmit send/receive a plurality of input/output data signals to/from an external source, a mode set circuit to set an operation mode of the semiconductor integrated circuit device and generating a plurality of capacitance set signals according to a combination of externally applied control signals, and a plurality of variable capacitance circuits respectively provided between a predetermined reference potential and a plurality of data input/output terminals, capable of changing independently the capacitance according to a capacitance set signal.

10 Claims, 13 Drawing Sheets

SEMICONDUCTOR INTEGRATED CIRCUIT DEVICE THAT CAN SUPPRESS GENERATION OF SIGNAL SKEW BETWEEN DATA INPUT/OUTPUT TERMINALS

BACKGROUND OF THE INVENTION

1. Field of the Invention

The present invention relates to semiconductor integrated circuit devices, and particularly to the structure of a semiconductor integrated circuit device to input/output data at high speed.

2. Description of the Background Art

Regarding semiconductor integrated circuit devices such as a dynamic random access memory (referred to as DRAM hereinafter) of a semiconductor memory device, the practical usage is known of a rambus DRAM (referred to as RDRAM hereinafter) and a double data rate synchronous DRAM (referred to as DDR SDRAM hereinafter depending upon the interface specification in order to improve the data input/output rate with an external source.

The chip of these semiconductor memory devices generally includes a plurality of data input/output terminals (pads) through which data is transferred to/from an external source.

Deviation in the data input/output timing between data input/output terminals (referred to as "skew" hereinafter) that cannot be ignored occurs caused by difference in the signal transmission path length in the semiconductor memory device chip corresponding to each data input/output terminal or difference in the length of the path from each data input/output terminal to the external pin of the package. In other words, this occurrence of skew is caused by difference in the input/output capacitance between data input/output terminals when viewed from outside. This skew will become the cause of preventing increase of the data input/output speed.

Such a problem also resides between input terminals with respect to other control signals as well as between data input/output terminals of a semiconductor memory device. In general, this problem is encountered in a semiconductor integrated circuit that inputs/outputs a signal from/to an external source via a plurality of terminals.

Conventionally, it is difficult to adjust the difference in the input/output capacitance present between each terminal once the semiconductor integrated circuit device is completed as a product. In order to adjust the input/output capacitance, the mask used in the photolithography step must be modified to change the circuit pattern or the like during the fabrication step. However, adjusting the input/output capacitance by such a method does not fit in with the reality from the standpoint of the cost and time required.

SUMMARY OF THE INVENTION

An object of the present invention is to provide a semiconductor integrated circuit device that can easily adjust difference in the input/output capacitance present between data input/output terminals, and that can suppress skew generation.

According to an aspect of the present invention, a semiconductor integrated circuit device includes an internal circuit, a plurality of input nodes, a plurality of lines, a mode set circuit, and a plurality of variable capacitance circuits.

The internal circuit generates a plurality of output data according to a plurality of externally applied control signals and a plurality of input signals.

The plurality of input nodes receive a plurality of input data signals from outside the semiconductor integrated circuit device.

The plurality of lines transmit an input data signal to the internal circuit from a plurality of input nodes.

The mode set circuit sets an operation mode of the internal circuit and generates a plurality of capacitance set signals according to the combination of a plurality of control signals.

The plurality of variable capacitance circuits are provided between the plurality of lines and a predetermined reference potential, respectively, and can change the capacitance independently according to the plurality of capacitance set signals.

According to another aspect of the present invention, a semiconductor integrated circuit device includes an internal circuit, a plurality of input nodes, a plurality of lines, and a plurality of variable capacitance circuits.

The internal circuit generates a plurality of output data according to a plurality of externally applied control signals and a plurality of input signals.

The plurality of input nodes receive a plurality of input data signals from outside the semiconductor integrated circuit device.

The plurality of lines transmit an input data signal to the internal circuit from a plurality of input nodes.

The plurality of variable capacitance circuits are provided between the plurality of lines and a predetermined reference potential, respectively, and can change the capacitance independently in a nonvolatile manner from an external source.

The main advantage of the present invention is that the difference in the input/output capacitance present between data input/output terminals can be adjusted easily, and that skew generation can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
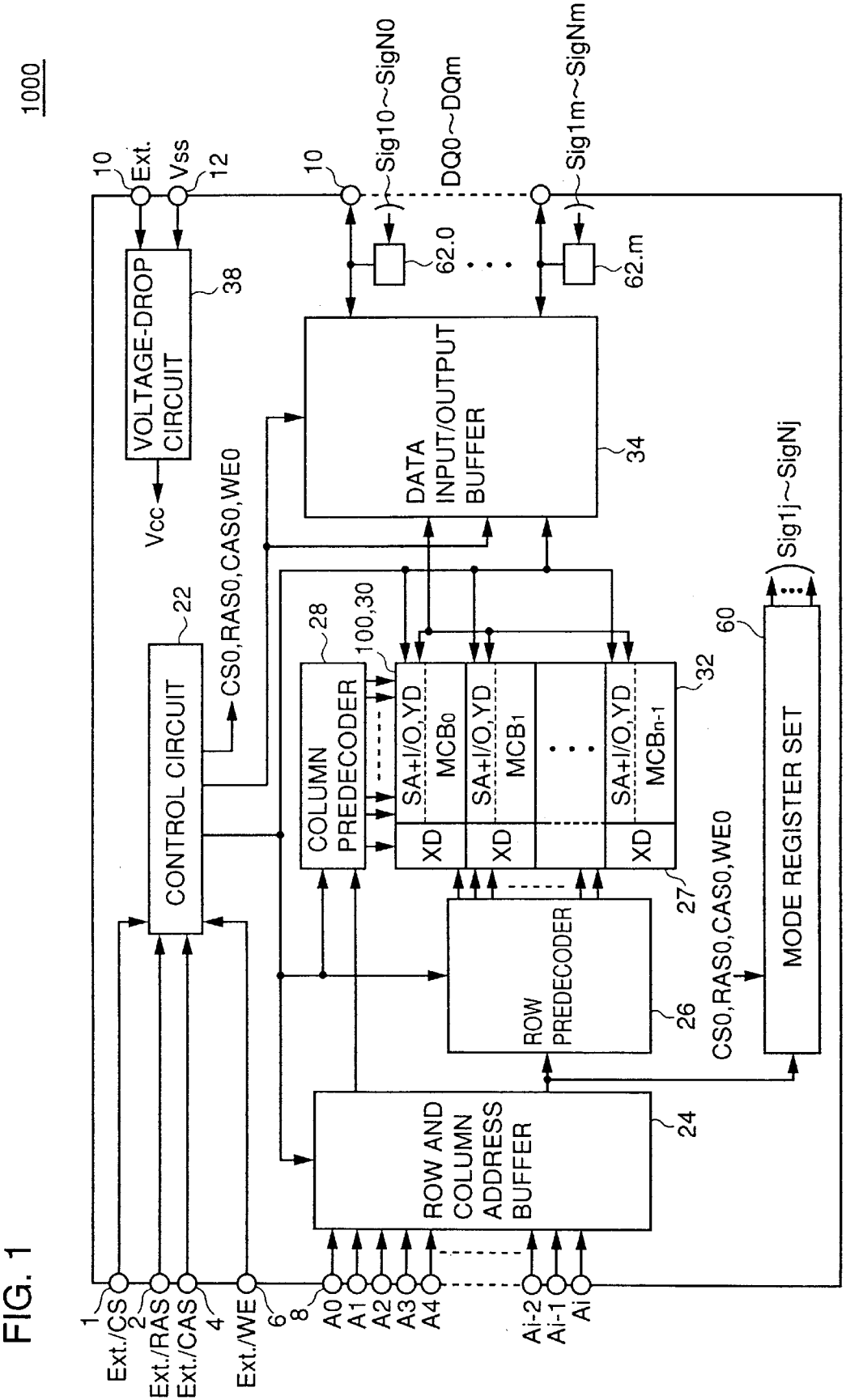
FIG. 1 is a schematic block diagram showing a structure of a semiconductor memory device 1000 according to a first embodiment of the present invention.

Referring to FIG. 1, a semiconductor memory device 1000 according to a first embodiment of the present invention includes control signal input terminal groups 2, 4, 6 receiving externally applied control signals such as an external chip select signal Ext./CS, an external row address strobe signal Ext./RAS, an external column address strobe signal Ext./CAS, and an external write enable signal Ext./WE, an address input terminal group 8, a data input/output terminal group 9 to transmit/receive a data signal, a ground terminal 12 to which a ground potential Vss is applied, and a power supply terminal 10 to which a power supply potential ext.Vcc is applied.

Semiconductor memory device 1000 further includes a control circuit 22 receiving a control signal to generate an internal control circuit to control the internal operation of semiconductor memory device 1000, a row and column address buffer 24 receiving an externally applied address signal to generate an internal address signal, a row predecoder 26 receiving a signal from row and column address buffer 24 to generate a signal to carry out row selection, a column predecoder 28 receiving a signal from row and column address buffer 24 to generate a signal to carry out column selection, a sense amplifier +input/output control circuit 30, a memory cell array 32, and a data input/output buffer 34.

Control circuit 22 generates a control clock corresponding to a predetermined operation mode according to chip select signal Ext./CS applied from a control signal input terminal 1, and externally applied external row address strobe signal Ext./RAS and external column address strobe signal Ext./CAS via control signal input terminals 2 and 4 to control the operation of the entire semiconductor memory device. Control circuit 22 also generates a signal that controls the operation of data input/output buffer 34 in a write operation mode and a read operation mode according to the combination of another control signal and external write enable signal Ext./WE.

Row and column address buffer 24 provides an internal address signal generated according to externally applied address signals A0–Ai (i is a natural number) to row predecoder 26 and column predecoder 28.

The memory cell array is divided into a plurality of memory cell blocks MCB0–MCBn. Each memory cell block is provided with a row decoder 27 selecting a row (word line) in a corresponding memory cell block according to the row predecode signal from row predecoder 26, a column decoder 100 selecting a column (bit line pair) in a corresponding memory cell block according to a column predecode signal from column predecoder 28, and a sense amplifier SA and I/O circuit 30, provided corresponding to each bit line pair. Sense amplifier SA amplifies the data in the selected memory cell. The I/O circuit selectively transmits to data input/output buffer 34 the data from the bit line pair selected by column decoder 100. For the sake of convenience, column decoder (YD) 100, sense amplifier SA and I/O circuit 30 are depicted as one block in FIG. 1.

The memory cell in memory cell array 32 specified by row decoder 27 and column decoder 100 has data transferred with respect to an external source through input/output terminal group 9 via sense amplifier +I/O circuit 30 and data input/output buffer 34.

Semiconductor memory device 1000 further includes a voltage-drop circuit 38 receiving an external power supply potential Ext.Vcc and ground potential Vss to generate an internal power supply potential Vcc.

Semiconductor integrated circuit 1000 further includes input/output capacitance circuits 62.0–62.m provided corresponding to each of data input/outputs DQ0–DQm (m is a natural number) of input/output terminal group 9 to set a capacitance value variable under control of signals Sig0j–SigNj (N, j are natural numbers: $0 \leq j \leq m$), and a mode register set 60 to generate signals Sigj0–SigNj according to an internal chip select signal CS0, an internal row address strobe signal RAS0, an internal column address strobe signal CAS0 and an internal write enable signal WE0 generated in control circuit 22 in response to externally applied control signals Ext./CS, Ext./RAS, Ext./CAS and ext./WE, and an internal address signal from row and column address buffer 24.

The structure of semiconductor memory device 1000 shown in FIG. 1 is only a typical example. More generally, the present invention is applicable to another structure of a dynamic semiconductor memory device. For example, division of the memory cell array is not limited to that shown in FIG. 1. Also, semiconductor memory device 1000 per se may be integrated with another circuitry on one chip.

Although the present invention will be described with a semiconductor memory device as an example, the present invention is not limited to this structure. More generally, the present invention is applicable to a semiconductor integrated circuit device that transfers data and control signals with an external source via a plurality of input/output terminals.

Figure 2:
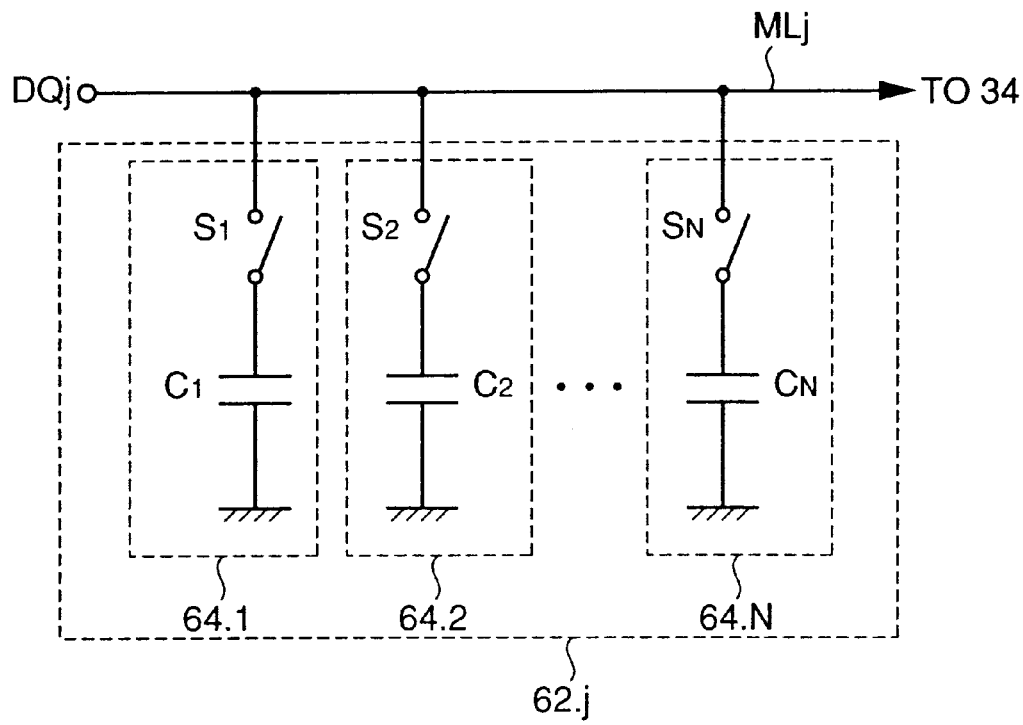
FIG. 2 is a diagram to describe the structure of a data input/output terminal DQj and an input/output capacitance circuit 62.j provided corresponding thereto.

FIG. 2 is a diagram to describe a structure of a data input/output terminal DQj out of the data input/output terminal group shown in FIG. 1, and an input/output capacitance circuit 62.j provided corresponding thereto.

Referring to FIG. 2, an input/output capacitance circuit 62.j is provided between a line MLj to transmit a signal from a data input/output terminal DQj to data input/output buffer 34 and the ground potential.

Input/output capacitance circuit 62.j includes N (N is a natural number) variable capacitance circuits 64.1–64.N provided with respect to line MLj.

Variable capacitance circuits 64.1–64.N each have the same structure. For example, variable capacitance circuit 64.i ($1 \leq i \leq N$) includes a switch circuit Si and a capacitor Ci connected in series between a line MLj and the ground potential GND.

As will be described afterwards, switch circuits S1–SN are under control of signals Sig1j–SigNj, respectively, output from mode register set 60 to attain a conductive or cut-off state.

Figure 3:
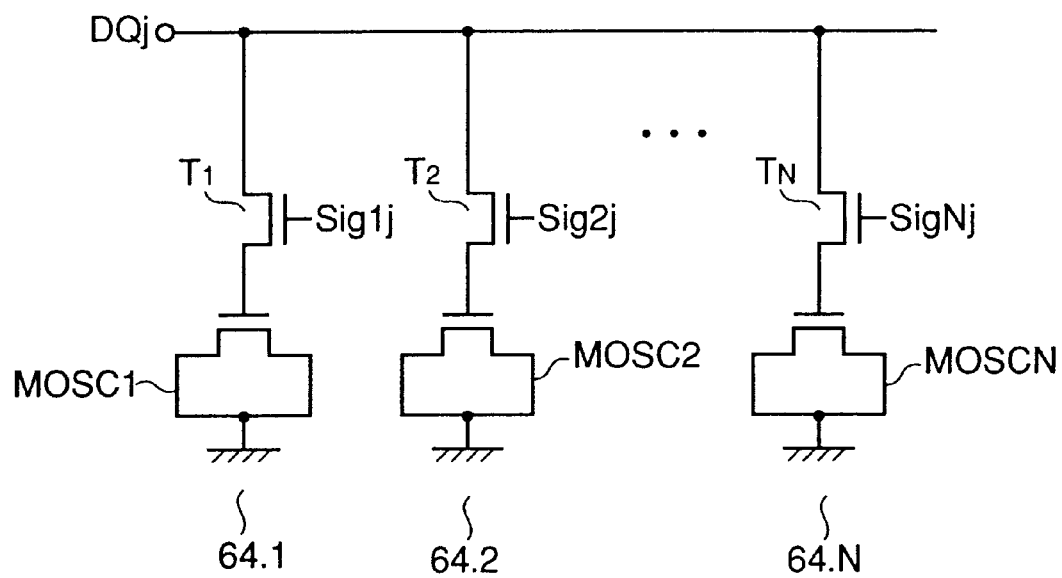
FIG. 3 is a circuit diagram to describe in further detail the structure of input/output capacitance circuit 62.j shown in FIG. 2.

FIG. 3 is a circuit diagram to describe in further detail the structure of input/output capacitance circuit 62.j shown in FIG. 2.

In the example shown in FIG. 3, transistors T1–TN are provided as switch circuits S1–SN, respectively. Transistors T1–TN receive signals Sig1j–SigNj at their gates.

Capacitors C1–CN are formed of MOS capacitors MOSC1–MOSCn, respectively.

By such a structure, the capacitance of the input/output pins can be adjusted under control of the ON/OFF of transistors T1–TN by controlling signals Sig1j–SigNj applied to variable capacitance circuit 62.j shown in FIG. 3 through mode register set 60.

By controlling independently input/output capacitance circuits 62.0–62.m provided corresponding to data input/output terminals DQ0–DQm, respectively, through the signal output from mode register set 60, the skew generated in the signal during data input/output can be suppressed by adjusting the input/output capacitance of the input/output terminal.

Description will be provided hereinafter focused on an input/output capacitance circuit 62.j provided corresponding to data input/output terminal DQj. For the sake of simplification, signals Sig1j–SigNj will be simply represented as Sig1–SigN hereinafter.

Figure 4:
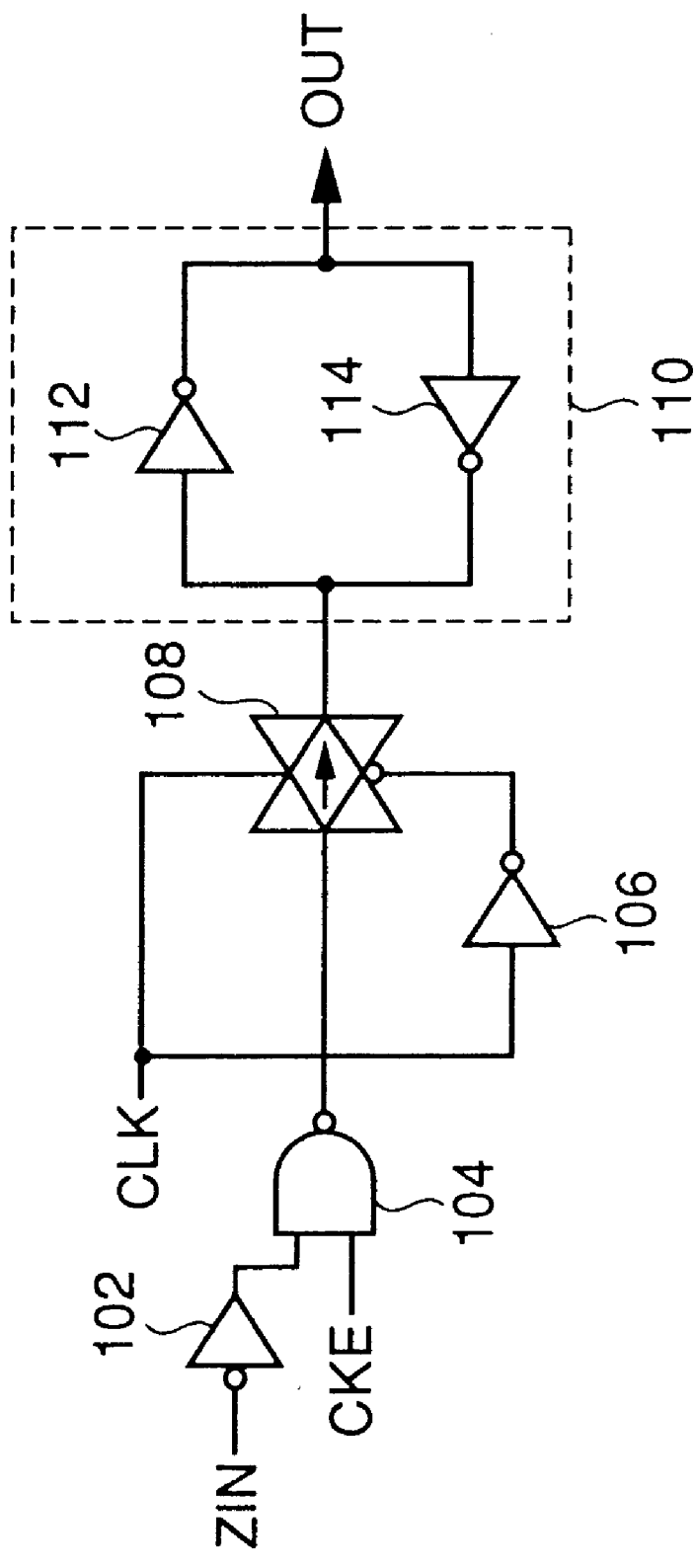
FIG. 4 is a circuit diagram to describe a structure of an input buffer circuit 100.

FIG. 4 is a circuit diagram to describe the structure of an input buffer circuit 100 provided in control circuit 22, receiving external chip select signal Ext./CS, external row address strobe signal Ext./RAS, external column address signal Ext./CAS and external write enable signal Ext./WE to generate respective corresponding internal control signals CS0, RAS0, CAS0 and WE0.

Externally applied control signals Ext./CS, Ext./RAS, Ext./CAS and Ext./WE will be represented generically as ZIN whereas internal control signals CS0, RAS0, CAS0 and WE0 will be generically referred to as signal OUT hereinafter.

Buffer circuit 100 includes an inverter 102 receiving a signal ZIN, a NAND circuit 104 receiving a clock enable signal CKE applied from outside the chip and an output of inverter 102, an inverter 106 receiving a clock signal CLK from control circuit 22 to control the operation timing of the internal circuit, a transmission gate 108 attaining a conductive or cut-off state under control of the output of inverter 106 and signal CLK, and a latch circuit 110 receiving the output of transmission gate 108 to output and hold signal OUT.

Latch circuit 110 includes an inverter 112 receiving the output of transmission gate 108 to output signal OUT, and an inverter 114 receiving and inverting the output of inverter 112 to provide the inverted signal to the input node of inverter 112.

Figure 5:
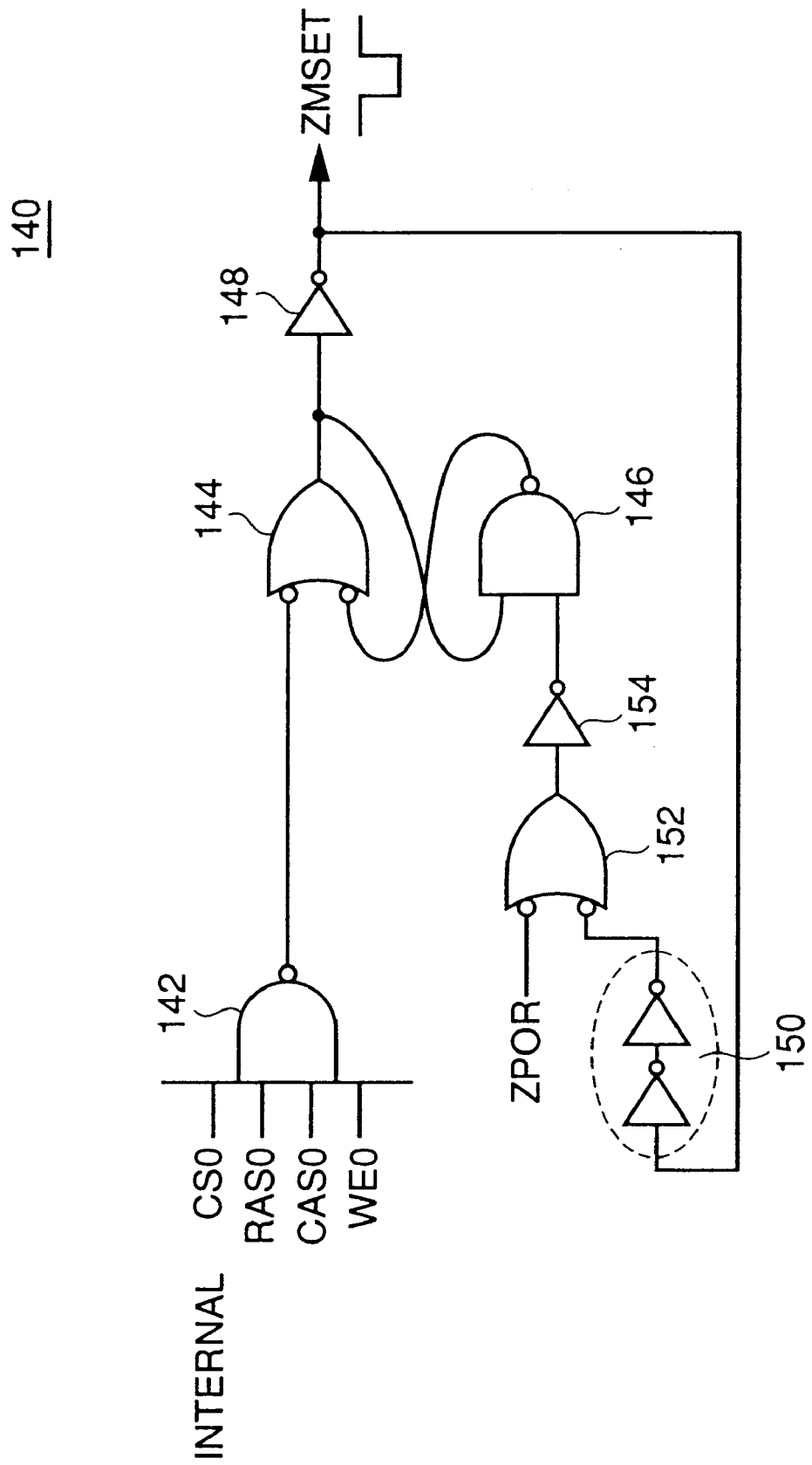
FIG. 5 is a circuit diagram to describe a structure of a timing control circuit 140.

FIG. 5 is a circuit diagram to describe the structure of timing control circuit 140 in mode register set 60 of FIG. 1 to control the operation timing of mode register set 60 when a mode register set command is input as will be described afterwards.

Timing control circuit 140 includes a 4-input NAND circuit 142 receiving internal control signals CS0, RAS0, CAS0 and WE0, a NAND circuit 144 receiving the output of NAND circuit 142 at one input node, a NAND circuit 146 receiving the output of NAND circuit 144 at one input node, and an inverter 148 receiving the output of NAND circuit 144 to output a signal ZMSET to control the operation timing of mode register set 60.

The output of NAND circuit 146 is applied to the other input node of NAND circuit 144.

Timing control circuit 140 further includes a delay stage 150 receiving the output of inverter 148 to delay a same for a predetermined time, a NAND circuit 152 receiving the output of delay stage 150 and a power-on reset signal ZPOR, and an inverter 154 receiving and inverting the output of NAND circuit 152 to provide the inverted signal to the other input node of NAND circuit 146. As will be described afterwards, the power-on reset signal attains an active state (L level) for a predetermined time after the power of semiconductor memory device 1000 is turned on.

At least all internal control signals CS0, RAS0, CAS0 and WB0 must be at an H level in order to render signal ZMSET active.

Timing control circuit 140 has its output state reset in response to activation of signal ZPOR after the power of semiconductor memory device 1000 is turned on, and has the level of output signal ZMSET reset at an elapse of a predetermined time determined by the delay time of delay stage 150 starting from activation (L level) of the output of inverter 148.

More specifically, signal ZMSET becomes a pulse signal of L level activation, having a pulse width of a predetermined time determined by delay stage 150.

Figure 6:
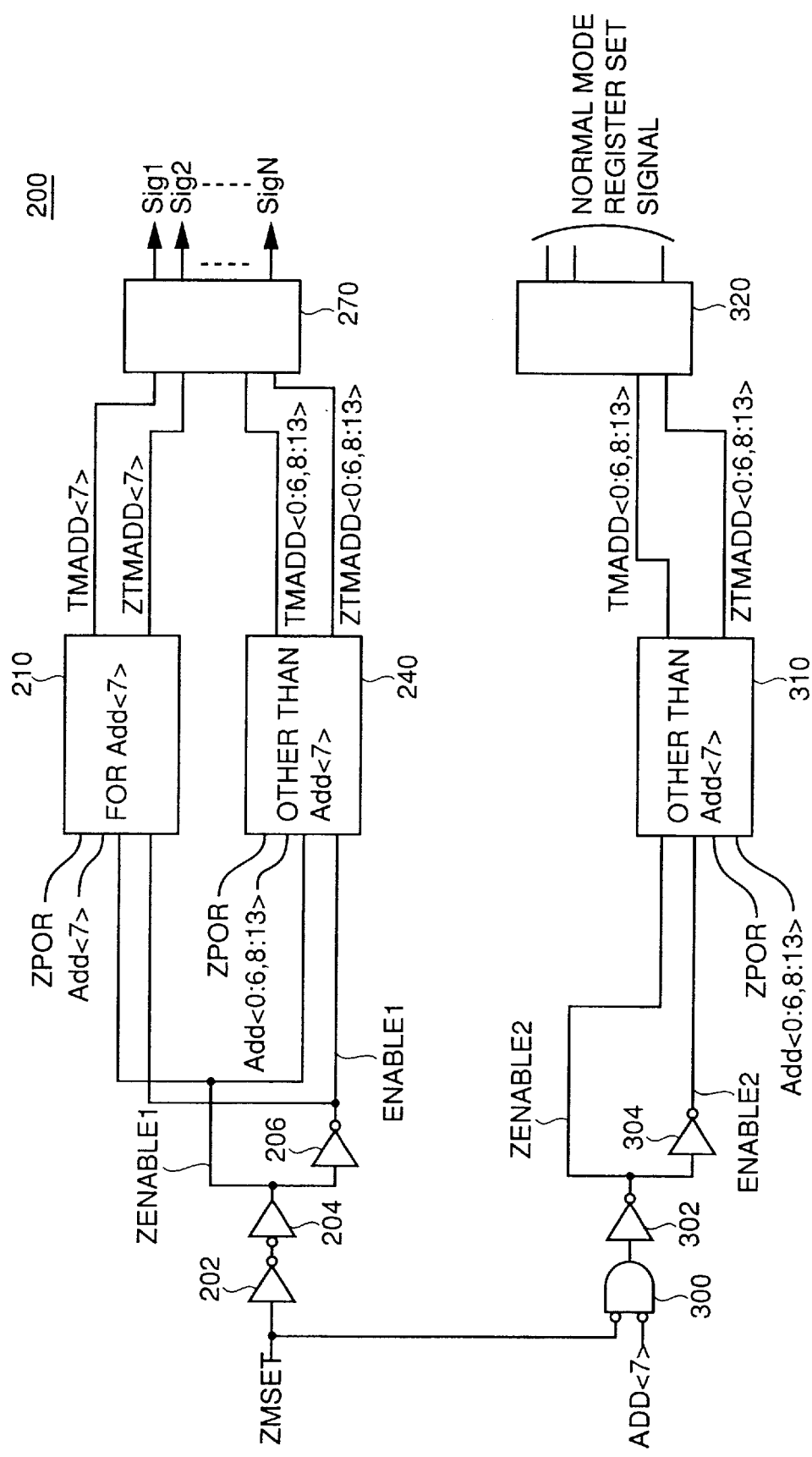
FIG. 6 is a schematic block diagram to describe a structure of a register circuit 200.

FIG. 6 is a schematic block diagram to describe a structure of a register circuit 200 to generate signals Sig1–SigN, included in mode register set 60 of FIG. 1, and under control of timing control circuit 140 of FIG. 5.

Referring to FIG. 6, register circuit 200 includes an inverter 202 receiving signal ZMSET, an inverter 204 receiving and inverting the output of inverter 202 to generate a signal ZENABLE1 to control the set operation of register circuit 200, and an inverter 206 receiving the output of inverter 204 to generate a signal ENABLE 1 having a level complementary to that of signal ZENABLE1.

Register circuit 200 further includes a level hold circuit 210 receiving a power-on reset signal ZPOR, a signal Add<7> corresponding to the seventh bit out of the address signal and a signal ZENABLE 1 to generate an internal control signal TMADD<7> corresponding to the level of address signal Add<7> and complementary signal ZTMADD<7>, a level hold circuit 240 receiving signal ZPOR, signals Add<0:6, 8:13> corresponding to the zeroth to sixth bits and the eighth to thirteenth bits of the address signal and also signal ENABLE to generate an internal control signal TMADD<0:6, 8:13> corresponding to the level of each of address signals <0:6, 8:13> and signals ZTMADD<0:6, 8:13> having complementary levels, and a control signal generation circuit 270 receiving signals ZTMADD<7>, ZTMADD<7>, TMADD<0:6, 8:13>, and ZTMADD<0:6, 8:13> to generate signals Sig1–SigN.

Register circuit 200 further includes an OR circuit 300 receiving signal ZMSET and signal ADD<7>, an inverter 302 receiving the output of OR circuit 300 to generate signal ZENABLE2, an inverter 304 receiving the output of inverter 302 to output a signal ENABLE2 having a level complementary to that of signal ZENBLE2, a level hold circuit 310 receiving the output of inverter 304, power-on reset signal ZPOR, and signals Add<0:6, 8:13> corresponding to the zeroth to sixth bits and the eighth to thirteenth bits out of the address signal to generate internal control signals TMADD<0:6, 8:13> of levels corresponding to the levels of each bit of these address signals and signals ZTMADD<0:6, 8:13> having complementary levels thereto, and a signal generation circuit 320 receiving the output of level hold circuit 310 to generate a normal mode register set signal to specify an operation mode in the normal operation.

The normal mode register set signal generated from signal generation circuit 320 is used as a signal to set, for example, the magnitude of latency of the operation mode when semiconductor memory device 1000 is an SDRAM. Alternatively, the normal mode register set signal is a signal to control the operation mode of semiconductor memory device 1000.

Figure 7:
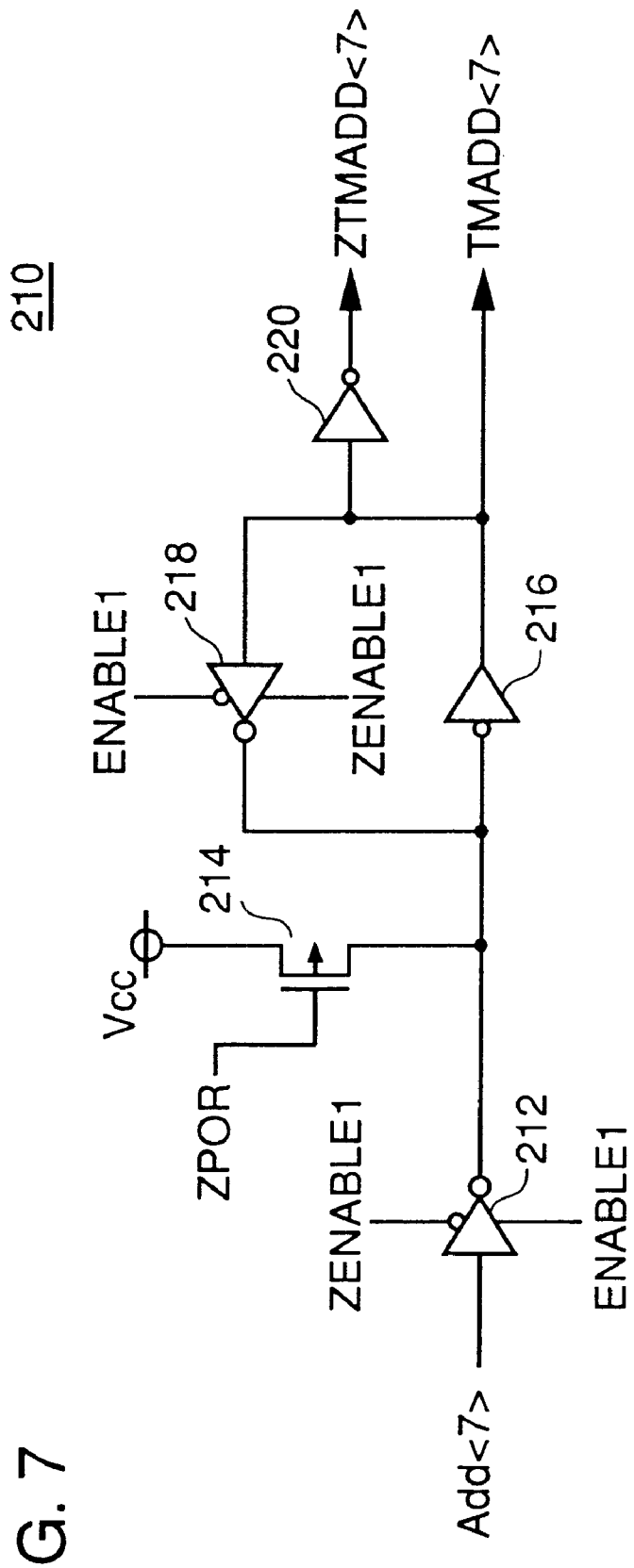
FIG. 7 is a schematic block diagram to describe a structure of a level hold circuit 210.

FIG. 7 is a schematic block diagram to describe a structure of level hold circuit 210 of FIG. 6.

Level hold circuit 210 includes a clocked inverter 212 receiving signal Add<7> and under control of signals ZENABLE1 and ENABLE1, a P channel MOS transistor 214 to reset the level of the output node of clocked inverter 212 under control of signal ZPOR, an inverter 216 receiving the output of clocked inverter 212 to output a signal TMADD<7>, a clocked inverter 218 attaining an active state complementary to that of clocked inverter 212 in response to signals ENABLE1 and ZENABLE1 to receive the output of inverter 216 to provide an inverted signal thereof to the input node of inverter 216, and an inverter 220 receiving the output of inverter 216 to generate signal ZTMADD<7>.

Figure 8:
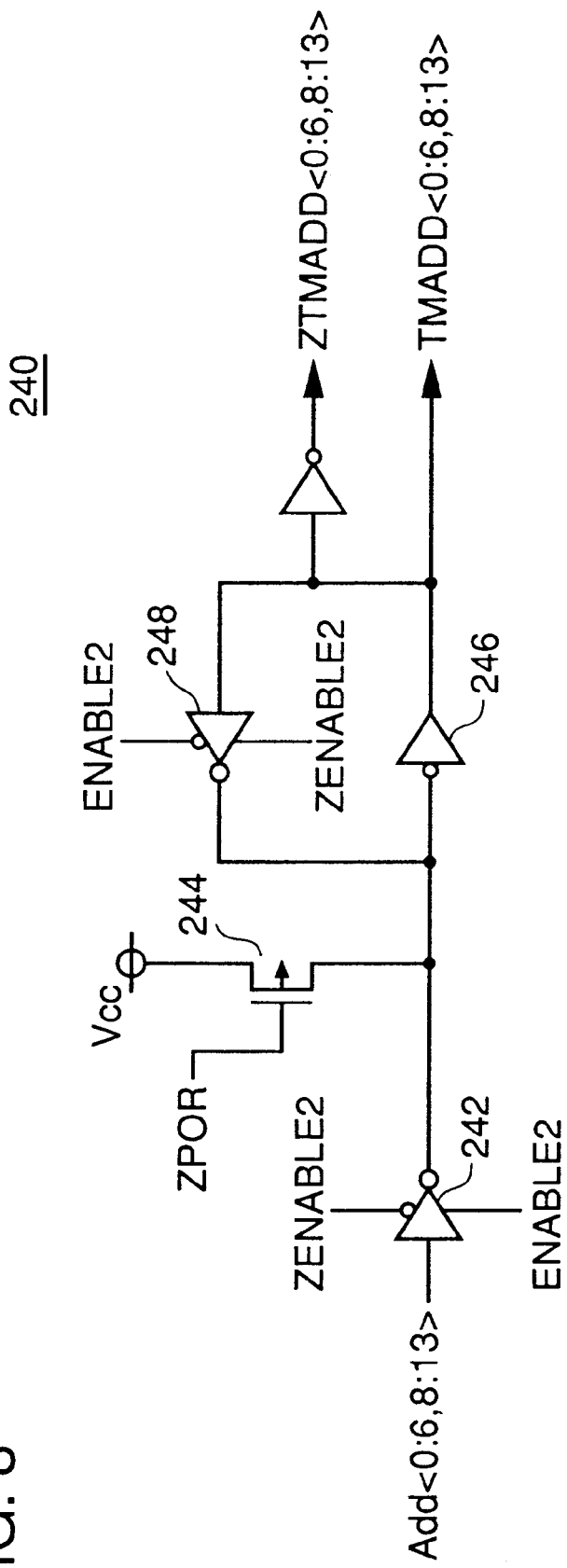
FIG. 8 is a schematic block diagram to describe a structure of a level hold circuit 240.

FIG. 8 is a schematic block diagram to describe a structure of level hold circuit 240 of FIG. 6.

Level hold circuit 240 includes a clocked inverter 242 receiving a signal of one bit out of signals ADD<0:6, 8:13>, and under control of signals ZENABLE1 and ENABLE1, a P channel MOS transistor 244 under control of signal ZPOR to reset the level of the output node of clocked inverter 242, an inverter 246 receiving the output of clocked inverter 242 to output one bit signal out of signals TMADD<0:6, 8:13>, a clocked inverter 248 attaining an active state complementary to that of clocked inverter 242 in response to signals ENABLE1 and ZENABLE1 to receive the output of inverter 246 to apply the inverted signal to the input node of inverter 216, and an inverter 220 receiving the output of inverter 216 to generate one bit signal out of signals ZTMADD<0:6, 8:13>.

More specifically, level hold circuit 240 receives any bit signal out of address signals ADD<0:6, 8:13> to generate corresponding signals TMADD<0:6, 8:13> and signals ZTMADD<0:6, 8:13>.

13 sets of a structure similar to that shown in FIG. 8 are provided for bit signals ADD<0>–ADD<6> and ADD<8>–ADD<13>, respectively.

Figure 9:
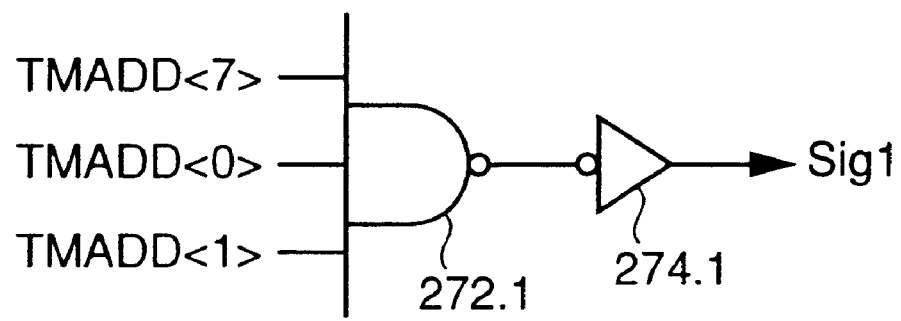
FIG. 9 is a schematic block diagram to describe a structure of a signal generation circuit 270.
Figure 9:
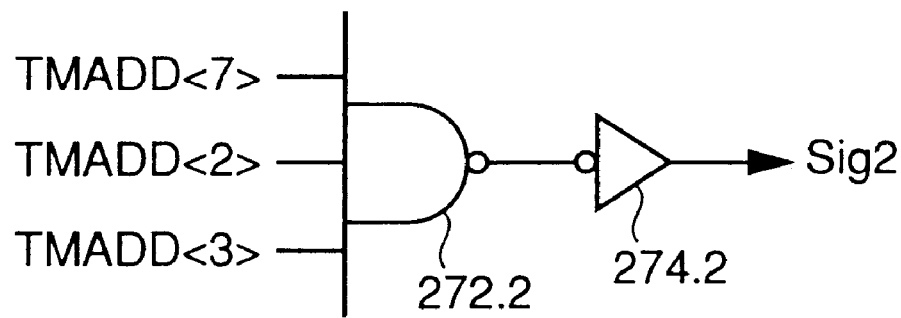
Figure 9:
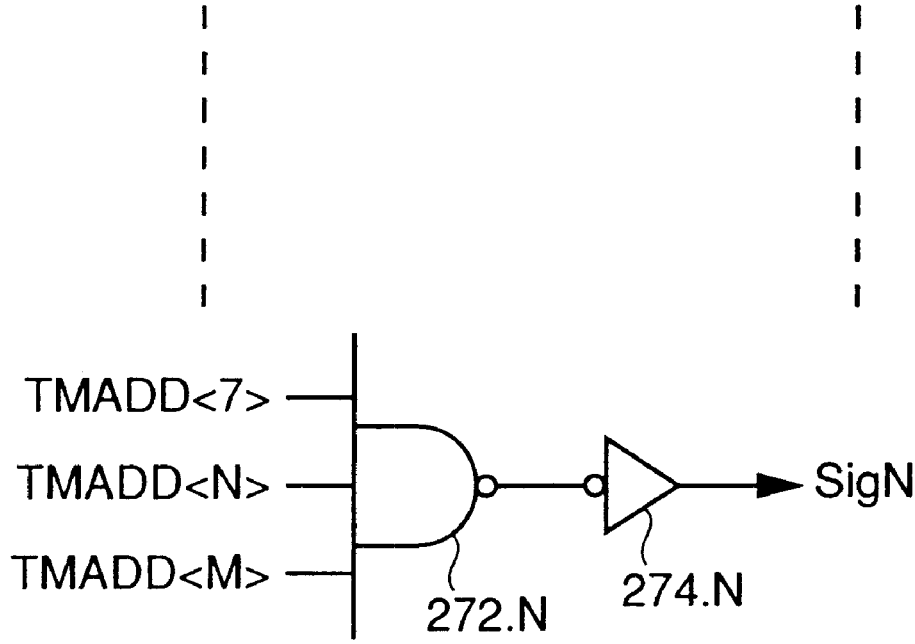

FIG. 9 is a schematic block diagram to describe a structure of signal generation circuit 270 among the structure shown in FIG. 6.

Signal generation circuit 270 includes a 3-input NAND circuit 272.1 receiving signals TMADD<7>, TMADD<0> and TMADD<1>, and an inverter 274.1 receiving the output of NAND circuit 272.1 to output signal Sig1.

According to the structure to output signals Sig2–SigN, signal generation circuit 270 includes NAND circuits 272.2–272.N receiving the combination of signal TMADD<7> and two out of signals TMADD<0>–TMADD<6> and TMADD<8>–TMADD<13> and signals ZTMADD<0>–ZTMADD<6> and ZTMADD<8>–ZTMADD<13>, and inverters 274.2–274.N receiving the outputs of NAND circuits 272.2–272.N, respectively, to output signals Sig2–SigN, respectively.

For the sake of simplification, only the structural portion of signals Sig1–SigN corresponding to input/output capacitance circuit 62.j is extracted and shown as described above in FIG. 9. In practice, the signal corresponding to other input/output capacitance circuits 62.k (k≠j) is generated by a combination of the address signals.

Figure 10:
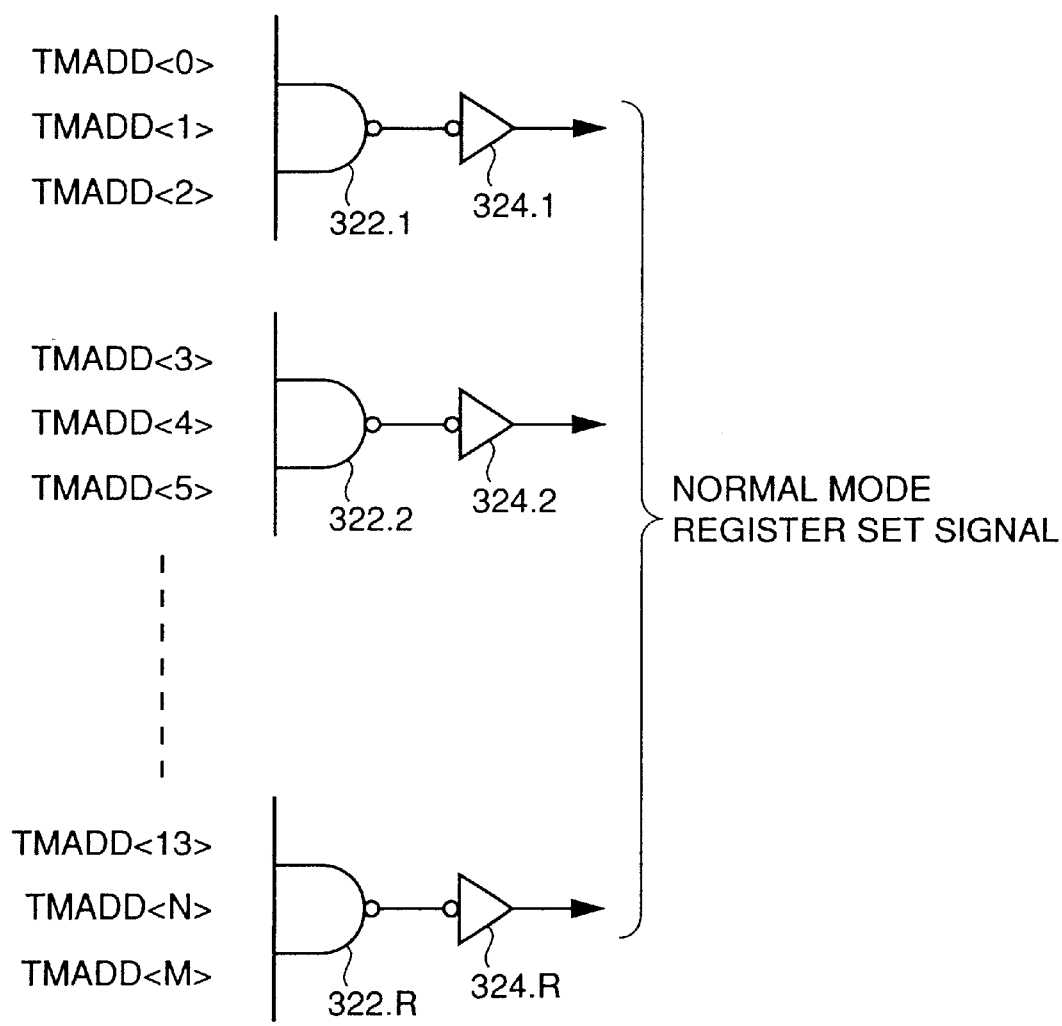
FIG. 10 is a circuit diagram to describe a structure of a signal generation circuit 320.

FIG. 10 is a circuit diagram to describe a structure of signal generation circuit 320 of FIG. 6. The structure of level hold circuit 310 is similar to that of level hold circuit 240 except for the combination of the address signals.

Signal generation circuit 320 includes a 3-input NAND circuit 322.1 receiving signals TMADD<0>, TMADD<1> and TMADD<2>, and an inverter 324.1 receiving the output of NAND circuit 322.1 to output one of the normal mode register set signals.

Similarly, according to the structure to output other signals of the normal mode register set signal, signal generation circuit 320 includes NAND circuits 322.2–322.R receiving the combination of three out of signals TMADD<3>–TMADD<M>, and inverters 324.2–324.R receiving and inverting the outputs of NAND circuits 322.2–322.R, respectively, for output.

Signal generation circuit 270 generating signals Sig1–SigN to control the input capacitance shown in FIG. 9 has a structure in which the levels of signals Sig1–SigN are determined according to the combination of other addresses with the requisite that signal TMADD<7> is at an H level.

In signal generation circuit 320 shown in FIGS. 6 and 10, signal ZENABLE2 generated by NOR circuit 300 and inverter 302 and signal ENABLE2 generated from inverter 304 can attain an active state only when signal ADD<7> is at an L level. Therefore, signal generation circuit 320 generates a normal mode register set signal when address signal Add<7> is at an L level.

As described above, a structure is implemented in which generation of a normal mode register set signal is not effected and a mode register set operation to control the input/output capacitance, i.e., setting the level of signals Sig1–SigN, is carried out, only when address signal Add<7> is at an H level.

In the case where signal Sig1 is to be rendered to an H level, signal ZENABLE1 attains an L level and signal ZENABLE2 attains an H level only when signal ZMSET is at an L level with address signal Add<7> at an H level and also address signals Add<0> and Add<1> are both at an H level with internal control signals CS0, RAS0, CAS0 and WE0 all at an L level.

In this case, the normal mode register set operation in signal generation circuit 320 corresponding to a normal operation mode is not carried out. Only the operation of signal generation circuit 270 is rendered active.

Since signals TMADD<7>, TMADD<0>, and TMADD<1> are all at an H level at this stage, signal Sig1 is driven to an H level according to the structure of signal generation circuit 270 shown in FIG. 9.

Since signals TMADD<0>, TMADD<1>, and TMADD<7> are latched by level hold circuits 210 and 240 shown in FIGS. 7 and 8 to have their levels maintained, the level of signal Sig1 is held at the H level as long as signals Sig1–SigN are not newly set.

A similar procedure is carried out when signal Sigj is to attain an H level. Signal Sigj can be selectively driven to an H level according to a combination of the address signals.

Figure 11:
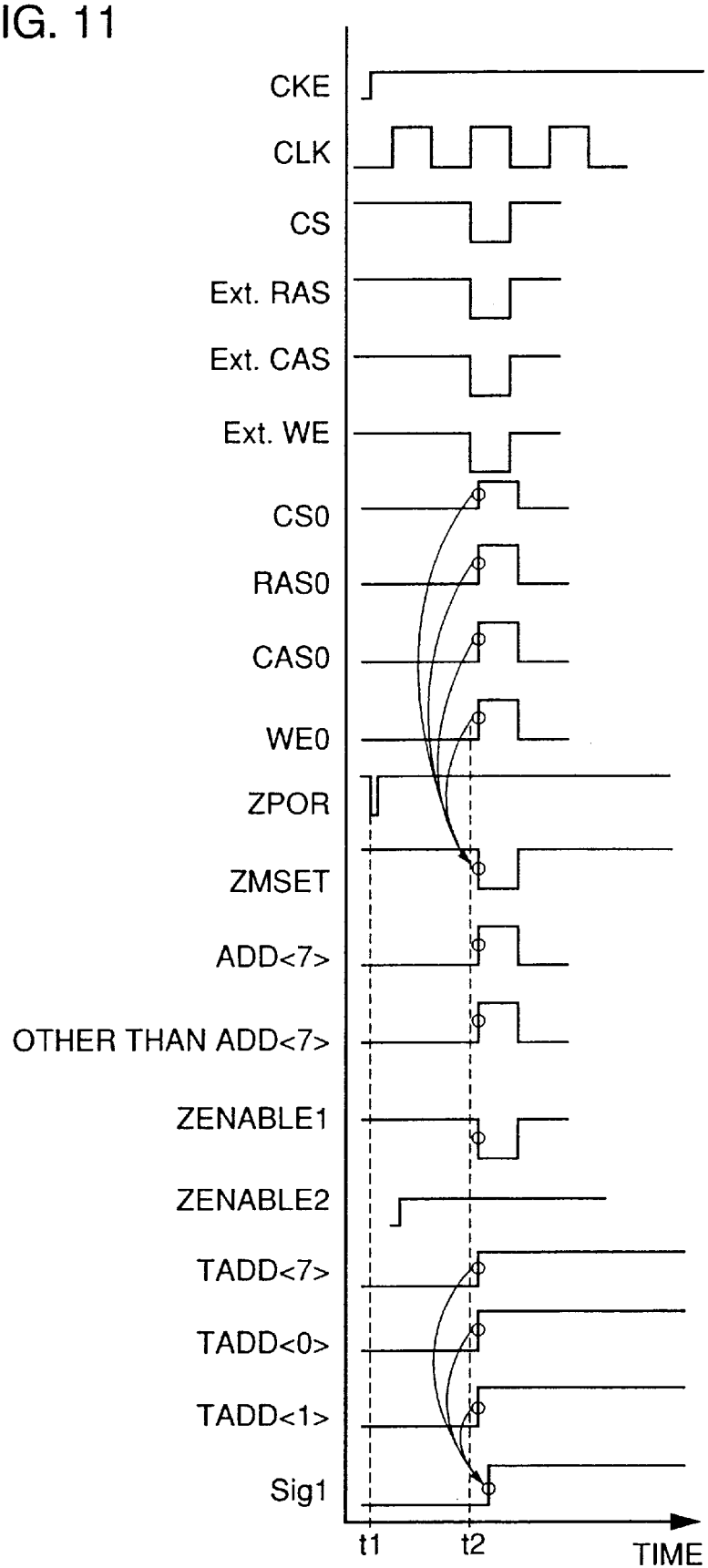
FIG. 11 is a timing chart to describe the operation of setting a signal sig1 at an H level.

FIG. 11 is a timing chart to describe the operation when signal Sig1 is to be set at an H level by the above-described procedure.

At time t1, the power is turned on to render power-on reset signal ZPOR active (L level). In response, the level of each circuit is reset.

In other words, the level of signal ZENABLE2, for example, attains an H level.

When external control signals Ext./CS, Ext./RAS, Ext./CAS, and Ext./WE all attain an L level at the rise of clock signal CLK at time t2, internal control signals CS0, RAS0, CAS0 and WE0 all attain an H level. In response, signal ZMSET attains an active state (level).

In the case where address signal ADD<7> is at an H level and the combination of the address signals other than signal ADD<7> is set to a level to render signal Sig1 active, signals TADD<7> TADD<0>, and TADD<1> all attain an H level at time t2, whereby the level of signal Sig1 is driven to an H level.

According to the above-described structure, the input/output capacitance can be set and modified individually for each of data input/output terminals DQ0–DQm depending upon the combination of externally applied control signals and address signals. Therefore, the skew in data input/output can be reduced.

Although the structure shown in FIG. 3 corresponds to the usage of N channel MOS transistors for the switch circuits, P channel MOS transistors can be employed instead of N channel MOS transistors.

Second Embodiment

Figure 12:
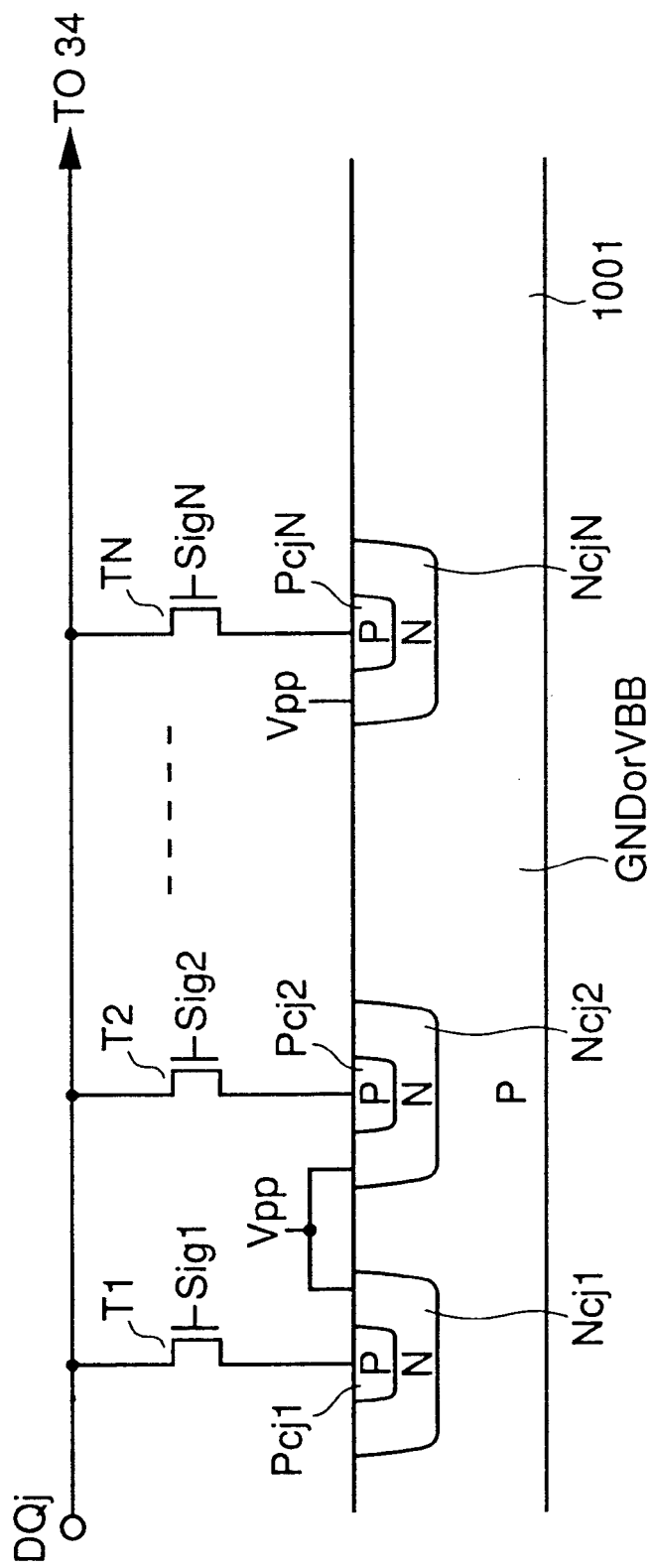
FIG. 12 is a schematic block diagram to describe a structure of an input/output capacitance circuit 62.j according to a second embodiment of the present invention.

FIG. 12 is a schematic block diagram to describe a structure of input/output capacitance circuit 62.j according to a second embodiment of the present invention.

In contrast to the first embodiment shown in FIG. 3 where the capacitor is formed of an MOS capacitor, the capacitance of the second embodiment is provided by a junction capacitor as shown in FIG. 12.

Referring to FIG. 12, a plurality of N type diffusion regions Ncj1–NcjN are provided at the main surface of a P type substrate 1001 formed at semiconductor memory device 1000. Then, P type diffusion regions Pcj1–PcjN are formed so as to have the portion other than the main surface surrounded by the N type diffusion regions.

Since substrate 1001 is of the P type, a PNP type junction capacitor is formed by setting the substrate potential to the ground potential or a substrate potential Vbb of negative voltage.

Transistors T1–TN are connected between line MLj and P type diffusion regions Pcj1–PcjN, respectively.

Each of N type diffusion regions Ncj1–NcjN is set to a boosted potential Vpp higher than, for example, the inner power supply potential Vcc.

By the above structure, N type diffusion regions Ncj1–NcjN (N well portion) become depletion layers to form a capacitor.

The control method of transistors T1–TN is similar to that of the first embodiment. Likewise elements have the same reference characters allotted, and description thereof will not be repeated.

An advantage similar to that of the first embodiment is likewise achieved for the second embodiment.

Third Embodiment

The third embodiment is directed to a structure of altering the input/output capacitance with the junction capacitance variable by providing one or an arbitrary number of N type diffusion regions Ncj1 for each data input/output terminal DQj and adjusting the potential applied to this N type diffusion region Ncj1 through voltage adjustment circuit 400 based on potential Vpp, in the structure of the second embodiment.

Figure 13:
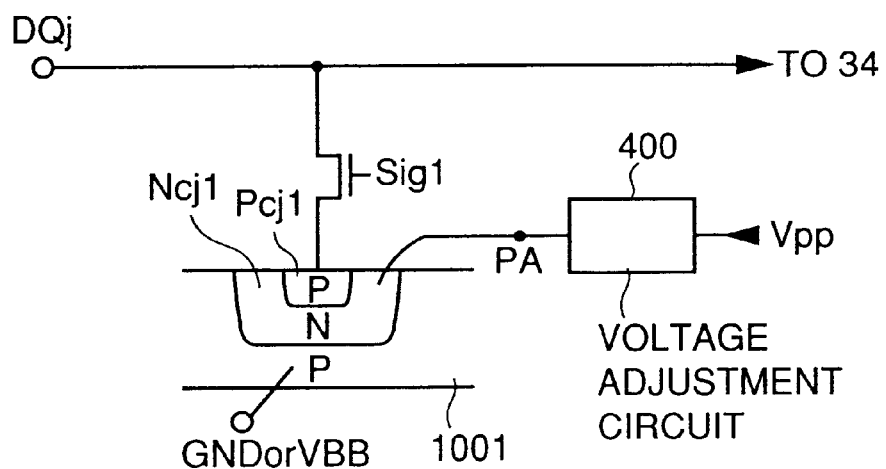
FIG. 13 is a schematic block diagram to describe a structure of an input/output capacitance circuit 62.j according to a third embodiment of the present invention.

FIG. 13 is a schematic block diagram to describe a structure of an input/output capacitance circuit 62.j according to the third embodiment.

A level of potential which is a voltage-divided version of boosted potential Vpp is applied from voltage adjustment circuit 400 to N type diffusion region Ncj1.

Figure 14:
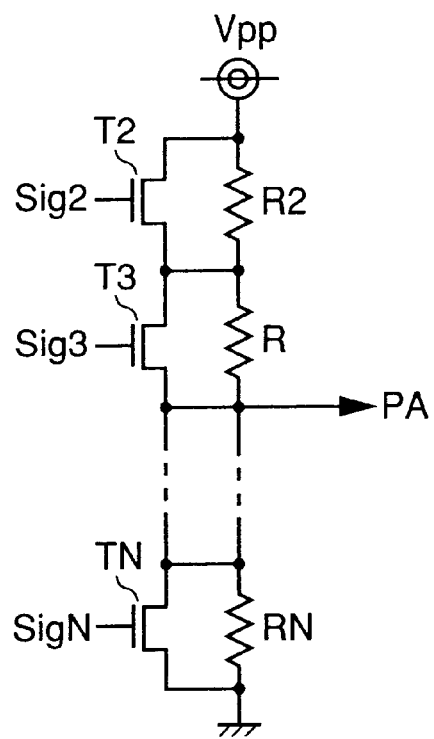
FIG. 14 is a schematic block diagram to describe a structure of a voltage adjustment circuit 400.

FIG. 14 is a schematic block diagram to describe a structure of voltage adjustment circuit 400.

Voltage adjustment circuit 400 includes resistors R2–Rn connected in series between boosted potential Vpp and ground potential GND, and transistors T2–TN connected parallel to resistors R2–Rn, respectively.

Here, it is assumed that the potential of the connection node between, for example, resistors R2 and R3, is applied to N type diffusion region Ncj1.

As in the first embodiment, the input capacitance of data input/output terminal DQj is altered by modifying the potential level output from voltage adjustment circuit 400 through signals Sig2–SigN.

More specifically, the junction capacitance is reduced since the depletion layer through the PNP becomes larger when potential Vpp of the N well is high. When the capacitance is to be reduced, signals Sig1–Sig3 are all set at the H level whereas other signals Sig4–SigN are set to the L level. Accordingly, the capacitance value can be reduced since the level of boosted potential Vpp is applied on the N well.

When the capacitance is to be increased, signals Sig2 and Sig3 are set to the L level whereas some of signals Sig4–SigN are set to the H level. The potential difference applied to the junction can be reduced according to the number thereof to increase the capacitance value.

Control of signals Sig1–SigN is similar to that of the first embodiment. Therefore, description thereof will not be repeated.

Another advantage similar to that of the first embodiment is provided in the structure of the third embodiment.

Fourth Embodiment

Figure 15:
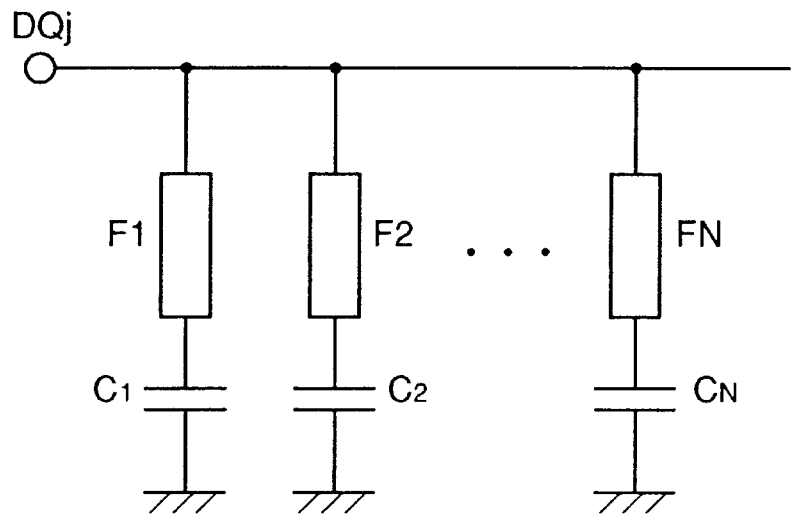
FIG. 15 is a circuit diagram to describe a structure of an input/output capacitance circuit 62.j according to a fourth embodiment of the present invention.

FIG. 15 is a circuit diagram to describe a structure of input/output capacitance circuit 62.j according to a fourth embodiment of the present invention.

In the previous first embodiment, capacitors C1–CN are connected to line LMj through transistors T1–TN.

In the fourth embodiment, fuse elements F1–FN are provided between line LMj and capacitors C1–CN, respectively. The input/output capacitance connected to data input/output DQj is adjusted by blowing out the fuse element.

Therefore, mode register set 60 is not required in the fourth embodiment.

The other operation is similar to that of the first embodiment. Therefore, description thereof will not be repeated. An advantage similar to that of the first embodiment can be provided by the structure of the fourth embodiment.

Fifth Embodiment

Figure 16:
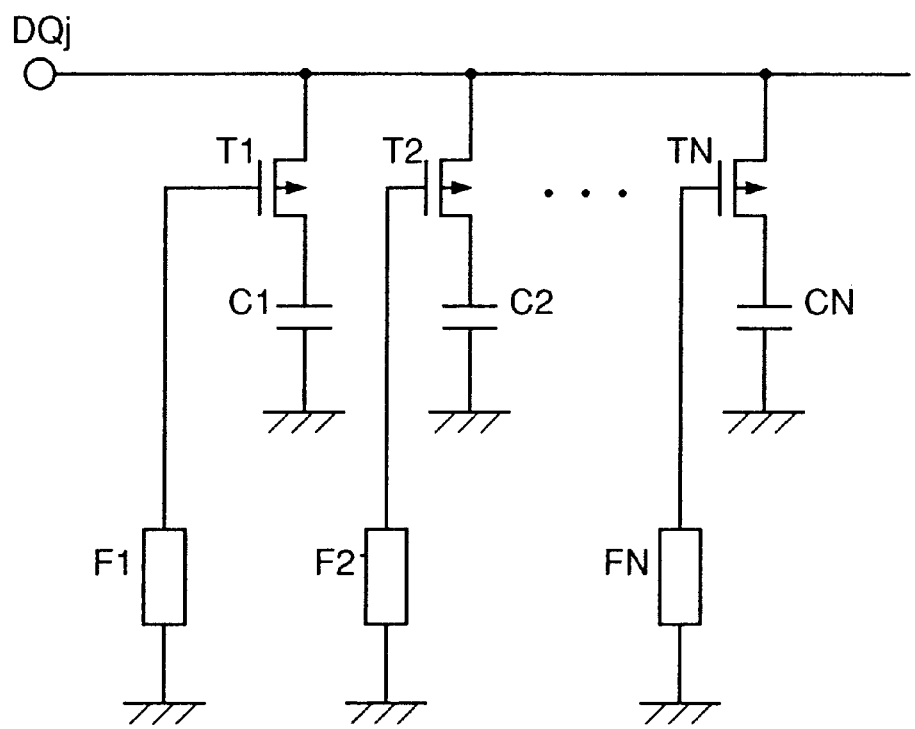
FIG. 16 is a circuit diagram to describe a structure of an input/output capacitance circuit 62.j according to a fifth embodiment of the present invention.

FIG. 16 is a circuit diagram to describe a structure of input/output capacitance circuit 62j of the fifth embodiment.

In the previous first embodiment, the connection between line LMj and capacitors C1–CN is rendered conductive or cut off through transistors T1–TN which are under control of signals Sig1–SigN from mode register set 60.

In the present fifth embodiment, transistors T1–TN are P channel MOS transistors whose signal levels are controlled, not by a signal from mode register set 60, but by blowing out fuse elements F1–FN provided between ground potential GND and the gates of transistors T1–TN, respectively.

By the above structure, the input/output capacitance of data input/output terminal DQj can be altered even after the fabrication step of the chip is completed. In the case where transistors T1–TN are formed of N channel MOS transistors, a structure connecting their gates with power supply potential Vcc through fuse elements F1–FN is to be employed.

An advantage similar to that of the first embodiment is achieved by the structure of the fifth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   an internal circuit generating a plurality of output data according to a plurality of externally applied control signals and a plurality of input data signals;
   a plurality of input nodes to receive said plurality of input data signals from outside said semiconductor integrated circuit device;
   a plurality of lines to transmit said input data signals from said plurality of input nodes to said internal circuit;
   a mode set circuit setting an operation mode of said internal circuit and generating a plurality of capacitance set signals according to a combination of said plurality of control signals; and
   a plurality of variable capacitance circuits respectively provided between said plurality of lines and a predetermined reference potential, capable of changing capacitance independently according to said plurality of capacitance set signals.

2. The semiconductor integrated circuit device according to claim 1, wherein each of said variable capacitance circuits comprises a plurality of capacitance circuits respectively provided between a corresponding one of said plurality of lines and said predetermined reference potential, respectively under control of said plurality of capacitance set signals.

3. The semiconductor integrated circuit device according to claim 2, wherein each of said plurality of capacitance circuits includes a switch circuit and a capacitor connected in series between said corresponding line and said predetermined reference potential,
   wherein said switch circuit attains one of a conductive state and a cut off state under control of a corresponding one of said plurality of capacitance set signals.

4. The semiconductor integrated circuit device according to claim 3, wherein said capacitor includes an MOS capacitor.

5. The semiconductor integrated circuit device according to claim 3, wherein said capacitor includes a junction capacitor.

6. The semiconductor integrated circuit device according to claim 1, wherein each of said variable capacitance circuits comprises at least one capacitance circuit provided between a corresponding one of said plurality of lines and said predetermined reference potential, under control of said plurality of capacitance set signals;
   wherein said capacitance circuit has a capacitance value which is variable according to said plurality of capacitance set signals.

7. The semiconductor integrated circuit device according to claim 6, wherein said capacitance circuit comprises
   a first switch circuit and a capacitor connected in series between said corresponding line and said predetermined reference potential, and
   a capacitance control circuit to control capacitance of said capacitor,
   said switch circuit attaining one of a conductive state and a cut off state under control of a corresponding one of said plurality of capacitance set signals,
   said capacitor including a junction capacitor,
   wherein said capacitance control circuit controls a junction voltage applied to said junction capacitor under control of another signal of said plurality of capacitance set signals.

8. A semiconductor integrated circuit device comprising:
   an internal circuit generating a plurality of output data according to a plurality of externally applied control signals and a plurality of input signals;
   a plurality of input nodes to receive said plurality of input data signals from outside said semiconductor integrated. circuit device;
   a plurality of lines to transmit said input data signal from said plurality of input nodes to said internal circuit; and
   a plurality of variable capacitance circuits provided between said plurality of lines and a predetermined reference potential, respectively capable of changing capacitance independently in a nonvolatile manner from an external source.

9. The semiconductor integrated circuit device according to claim 8, wherein each of said variable capacitance circuits comprises a plurality of capacitance circuits respectively provided between a corresponding line out of said plurality of lines and said predetermined reference potential,
   wherein each of said plurality of capacitance circuits includes a fuse element and a capacitor connected in series between said corresponding line and said predetermined reference potential.

10. The semiconductor integrated circuit device according to claim 8, further comprising a capacitance set circuit including a plurality of fuse elements to generate a plurality of capacitance set signals according to an external nonvolatile setting,
    wherein each of said variable capacitance circuits comprises a plurality of capacitance circuits respectively provided between a corresponding line out of said plurality of lines and said predetermined reference potential, each capacitance circuit under control of said plurality of capacitance set signals,
    wherein each of said plurality of capacitance circuits includes
    a switch circuit and a capacitor connected in series between said corresponding line and said predetermined reference potential,
    said switch circuit attaining one of a conductive state and a cut-off state under control of a corresponding one of said plurality of capacitance set signals.

* * * * *